United States Patent
Kegel

(10) Patent No.: US 7,316,383 B2
(45) Date of Patent: Jan. 8, 2008

(54) VALVE MECHANISM, ESPECIALLY FUEL INJECTION VALVE FOR AN INTERNAL COMBUSTION ENGINE

(75) Inventor: Timo Kegel, Jihlava (CZ)

(73) Assignee: Robert Bosch GmbH, Stuttgart (DE)

( * ) Notice: Subject to any disclaimer, the term of this patent is extended or adjusted under 35 U.S.C. 154(b) by 48 days.

(21) Appl. No.: 10/570,119

(22) PCT Filed: Jul. 28, 2004

(86) PCT No.: PCT/DE2004/001685

§ 371 (c)(1),
(2), (4) Date: Mar. 2, 2006

(87) PCT Pub. No.: WO2005/024222

PCT Pub. Date: Mar. 17, 2005

(65) Prior Publication Data

US 2007/0012292 A1    Jan. 18, 2007

(30) Foreign Application Priority Data

Sep. 2, 2003    (DE)    ................................ 103 40 319

(51) Int. Cl.
  *F16K 31/02*    (2006.01)
(52) U.S. Cl. .................. 251/129.06; 251/337
(58) Field of Classification Search .......... 251/129.06, 251/129.01, 337
See application file for complete search history.

(56) References Cited

U.S. PATENT DOCUMENTS

| | | | |
|---|---|---|---|
| 6,311,950 B1* | 11/2001 | Kappel et al. | 251/337 |
| 6,499,471 B2* | 12/2002 | Shen et al. | 239/102.2 |
| 6,681,462 B1 | 1/2004 | Frank et al. | |
| 2003/0168937 A1 | 9/2003 | Heinz et al. | |
| 2004/0061003 A1* | 4/2004 | Bocking | 239/533.2 |
| 2004/0195060 A1* | 10/2004 | Jovovic et al. | 188/266.7 |

FOREIGN PATENT DOCUMENTS

| | | |
|---|---|---|
| DE | 199 47 067 A1 | 5/2001 |
| DE | 101 39 550 A1 | 3/2003 |
| DE | 101 40 196 A1 | 3/2003 |
| WO | WO 99/08330 A1 | 2/1999 |
| WO | WO 01/91197 A1 | 11/2001 |

* cited by examiner

*Primary Examiner*—John Bastianelli
(74) *Attorney, Agent, or Firm*—Ronald E. Greigg

(57) ABSTRACT

A fuel injection valve for an internal combustion engine, includes a valve element whose switched position depends at least indirectly on the switched state of a piezoelectric actuator that is acted on by a tubular, largely cylindrical prestressing device, which is manufactured out of a plate-shaped starting material and has at least two longitudinal edges that abut each other in such a way that the longitudinal rigidity is altered in this region. The prestressing device has at least one region whose longitudinal rigidity differs from that of a neighboring region and is situated in relation to the abutting longitudinal edges so as to reduce the bending moment that acts on the piezoelectric actuator and is generated by the altered longitudinal rigidity in the region of the abutting longitudinal edges.

20 Claims, 4 Drawing Sheets

VALVE MECHANISM, ESPECIALLY FUEL INJECTION VALVE FOR AN INTERNAL COMBUSTION ENGINE

CROSS-REFERENCE TO RELATED APPLICATIONS

This application is a 35 USC 371 application of PCT/DE 2004/001685 filed on Jul. 28, 2004.

BACKGROUND OF THE INVENTION

1. Field of the Invention

The invention relates to an improved fuel injection valve for an internal combustion engine, having a valve element whose switched position depends at least indirectly on the switched state of a piezoelectric actuator, which is acted on by a tubular, largely cylindrical prestressing device, which is manufactured out of a plate-shaped starting material and has at least two longitudinal edges that abut each other.

2. Description of the Prior Art

A valve device of the type with which this invention is concerned is known from the market, and is used in fuel injection valves for internal combustion engines with direct injection. Fuel injection valves of this kind are connected to a fuel accumulator ("rail") in which fuel is stored at high pressure. They each inject the fuel directly into a respective combustion chamber associated with them. Executing an injection requires the triggering of a piezoelectric actuator which either influences a switched position of a valve element of the fuel injection valve directly or triggers a secondary valve that is able to influence the pressure in a hydraulic control chamber of the fuel injection valve. The pressure in the hydraulic control chamber in turn influences the switched position of the valve element.

In valve devices of this type, the use of piezoelectric actuators has proven valuable because they have very short switching times which permit a very precise introduction of the desired quantity of fuel into the combustion chamber. However, piezoelectric actuators are very delicate, mechanically speaking. In order to prevent the piezoelectric actuator from damaging or even destroying itself when executing a length change triggered by an actuation, the piezoelectric actuator is subjected to a compressive force from the very beginning. This usually occurs by means of a tube spring, which is manufactured out of a plate-shaped starting material also referred to as a "blank". The longitudinal edges abutting each other in the final state can be welded to each other, but this is complex and expensive, not to mention the fact that such welds have a limited service life. It is therefore preferable to use tube springs of this kind in which the longitudinal edges of the plate-shaped starting material abut each other evenly but are not connected to each other in a frictionally engaging manner.

The object of the present invention is to modify a valve device of the type mentioned at the beginning so as to lend it the longest service life possible.

This object is attained in that the prestressing device has at least one region whose longitudinal rigidity differs from that of a neighboring region and is situated in relation to the abutting longitudinal edges so as to reduce the bending moment acting on the piezoelectric actuator, which is generated by the altered longitudinal rigidity in the region of the abutting longitudinal edges.

SUMMARY AND ADVANTAGES OF THE INVENTION

The present invention is based on the recognition that the longitudinal rigidity of the tubular prestressing device in the location at which the longitudinal edges of the plate-shaped starting material abut each other differs from the longitudinal rigidity of neighboring regions. This causes the tubular spring to load the piezoelectric actuator with forces that vary over its circumference. As a result, a bending moment is introduced into the piezoelectric actuator, which in the worst-case scenario, can damage or destroy the piezoelectric actuator.

In the valve device according to the present invention, the introduction of such a bending moment into the piezoelectric actuator is significantly reduced or entirely eliminated. This occurs primarily due to the fact that the prestressing device has an additional region whose longitudinal rigidity differs from that of the neighboring regions, preferably in the same way as the longitudinal rigidity in the region of the abutting longitudinal edges differs from that of the neighboring sections of the tube spring. This additional altered region is then situated so that the bending moment that it generates at least partially compensates for that which is generated by the abutting longitudinal edges.

In this way, despite the necessarily different longitudinal rigidity of the tube spring in the region of the abutting longitudinal edges, the piezoelectric actuator is subjected to a prestressing force that is either free of bending moments or has only a slight bending moment, which is optimal both for its service life and for that of the entire valve device.

Advantageous modifications of the invention are disclosed. First, it is advantageous if the abutting longitudinal edges are not connected to each other in a frictionally engaging fashion and if they have a recess extending essentially in the longitudinal direction of the prestressing device, at least approximately opposite from the abutting longitudinal edges in the radial direction. If the longitudinal edges are not connected to each other in a frictionally engaging fashion, this abutment represents a "weak point" in which the longitudinal rigidity of the tube spring is reduced. According to the invention, the recess creates an additional, opposing weak point, which compensates for the bending moment generated in the region of the abutment. This device is inexpensive because a tube spring of this kind is easy to manufacture.

It is also advantageous if the length of the abutting longitudinal edges, viewed in the axial direction, is less than the longitudinal span of the prestressing device. This means that in the end, there is also a recess in the region of the abutting longitudinal edges, which adjusts the axial rigidity of the prestressing device in this region relative to that in the radially opposite region. This further improves the symmetry of the force curve along the axial edges of the prestressing device in relation to its central axis.

In this connection, it is possible for the longitudinal edges to only abut each other in the region of the axial edges of the prestressing device. This facilitates installation, assures a uniform contact surface of the prestressing device in relation to the piezoelectric actuator at one end and in relation to the corresponding counterpart surface at the other end, and prevents an undesirable offset between the edges of the prestressing device when under load.

However, it is also possible for the longitudinal edges to abut each other only in the region of one axial edge of the prestressing device. This further simplifies the manufacture of the prestressing device according to the invention.

Alternative to this, it is also conceivable for the longitudinal edges to abut each other only in the region of the axial middle of the prestressing device. This is also easy to implement from a technical production standpoint and permits a symmetrical embodiment in the axial direction of the prestressing device.

In a particularly advantageous embodiment of the fuel injection device according to the invention, the abutting longitudinal edges of the prestressing device are delimited in their longitudinal direction by means of at least one recess, which, in terms of position and/or geometry, is similar or identical to the radially opposite recess. This creates a virtually complete symmetry of the force curve along the edges of the prestressing device in relation to its central axis so that practically no bending moment at all is introduced into the piezoelectric actuator.

In another advantageous embodiment of the fuel injection device according to the invention, the openings distributed over the surface of the prestressing device are absent only from the region extending at the height of the axial region of the prestressing device in which the longitudinal edges abut each other. These openings, which are occasionally also referred to as "bones" because their shape often corresponds to that of a bone, permit an axial deformation of the tubular prestressing device to occur without resulting in an undulation in the surface. The measure proposed according to the present invention creates a prestressing device that does in fact have such openings, but which nevertheless permits a completely symmetrical embodiment in relation to the central axis of the prestressing device so that during operation of the valve device, the prestressing device introduces only negligible bending moments or no bending moments at all into the piezoelectric actuator.

A particularly inexpensive manufacture of the valve device according to the present invention is achieved in that the recess or recesses of the prestressing device is/are punched out from the plate-shaped starting material.

BRIEF DESCRIPTION OF THE DRAWINGS

Particularly preferred embodiments will be explained in detail below in, conjunction with the accompanying drawings, in which.

DESCRIPTION OF THE PREFERRED EMBODIMENTS

Figure 1:
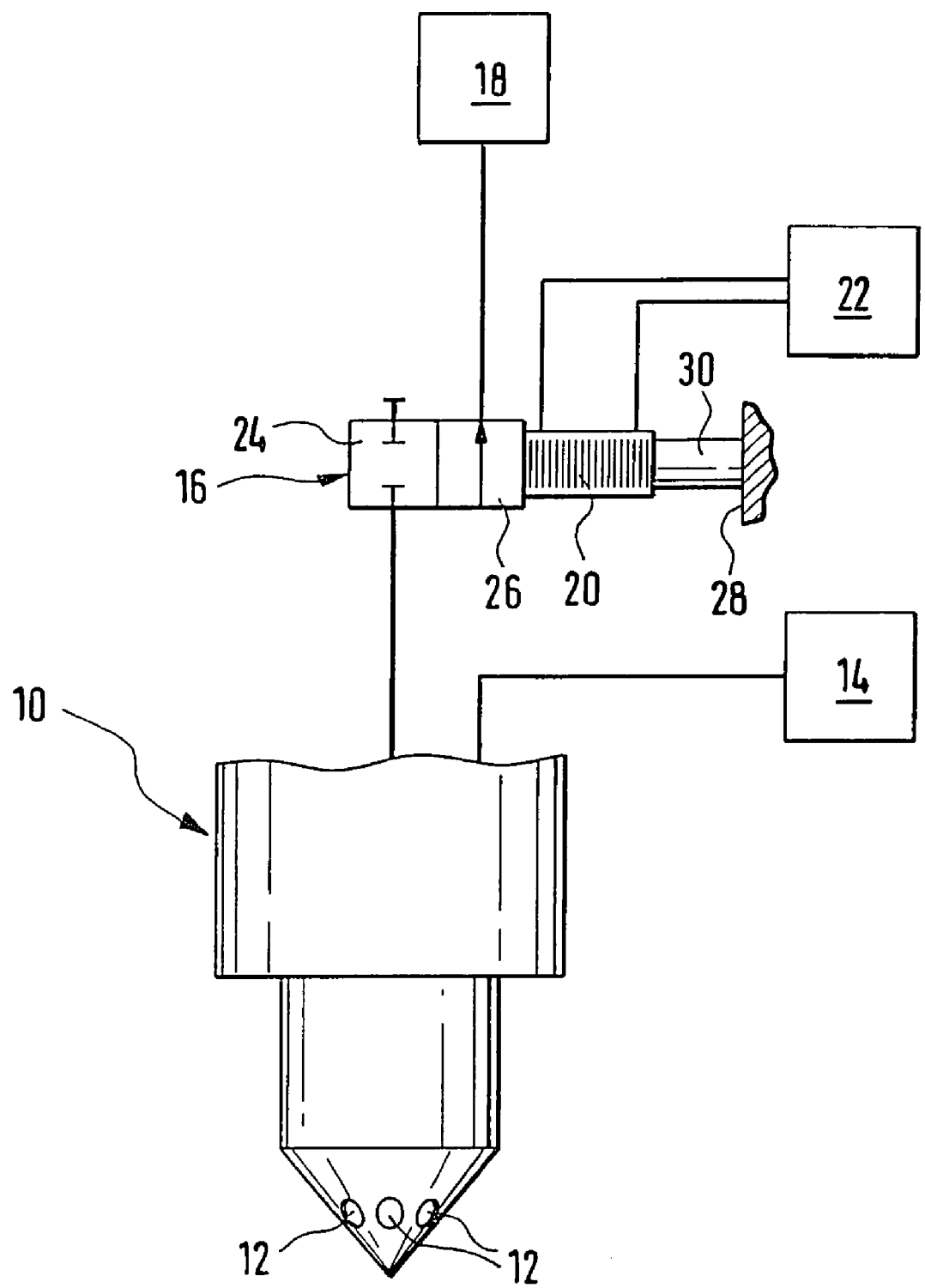
FIG. 1 shows a schematic, very simplified depiction of a fuel injection valve, having an on-off valve equipped with a piezoelectric actuator that is acted on by a prestressing device.

In FIG. 1, the fuel injection valve as a whole is labeled with the reference numeral 10. It injects fuel directly into a combustion chamber (not shown) of an internal combustion engine. To this end, the fuel injection valve 10 has fuel outlet openings 12. On the inside of the fuel injection valve 10, there is a valve element, not visible in FIG. 1, which is able to open and close a connection between the fuel outlet openings 12 and high-pressure connection 14. The high-pressure connection 14 of the fuel injection valve 10 is connected to a fuel accumulator (not shown), which is also commonly referred to as a "rail".

The switched position of the valve element of the fuel injection valve 10 is set hydraulically. To this end, an on-off valve 16 can open or close a connection between a control chamber (not shown) and a low-pressure connection 18. The functional principal of such a "stroke-controlled" fuel injection valve 10 can be taken, for example, from DE 101 22 256 A1.

The on-off valve 16 has a piezoelectric actuator 20 that is connected to an electric control unit 22. The control unit 22 can apply a voltage to the piezoelectric actuator 20 so that its charge state changes. As a result, the piezoelectric actuator 20 extends or contracts, which causes the on-off valve 16 to move either into the closed switched position 24 or into the open switched position 26.

Figure 2:
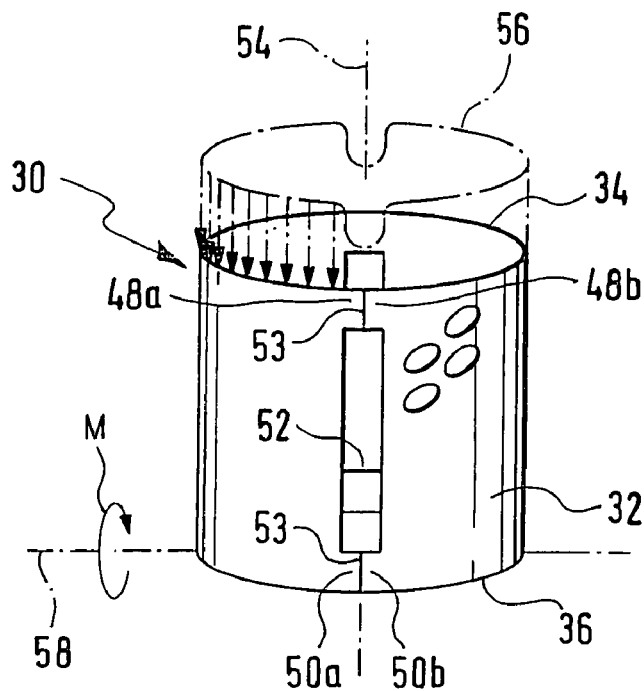
FIG. 2 is a perspective depiction of a first exemplary embodiment of the prestressing device from FIG. 1.

The piezoelectric actuator 20 is very delicate, mechanically speaking. In order to prevent it from being damaged when executing a rapid length change, a constant compressive force is exerted on it. To this end, a tubular, largely cylindrical prestressing device 30 is clamped between the piezoelectric actuator 20 and a stationary counterpart surface 28. A first exemplary embodiment of such a prestressing device 30 will now be explained in greater detail in conjunction with FIGS. 2 and 3:

As is clear from FIG. 2, the prestressing device 30 is a largely cylindrical tube spring. It has a circumferential surface 32 and, with regard to FIG. 2, an upper edge 34 and a lower edge 36. In the following, the terms "upper" and "lower" always refer to the drawing. Naturally, the prestressing device 30 can actually also be installed in a different way.

Figure 3:
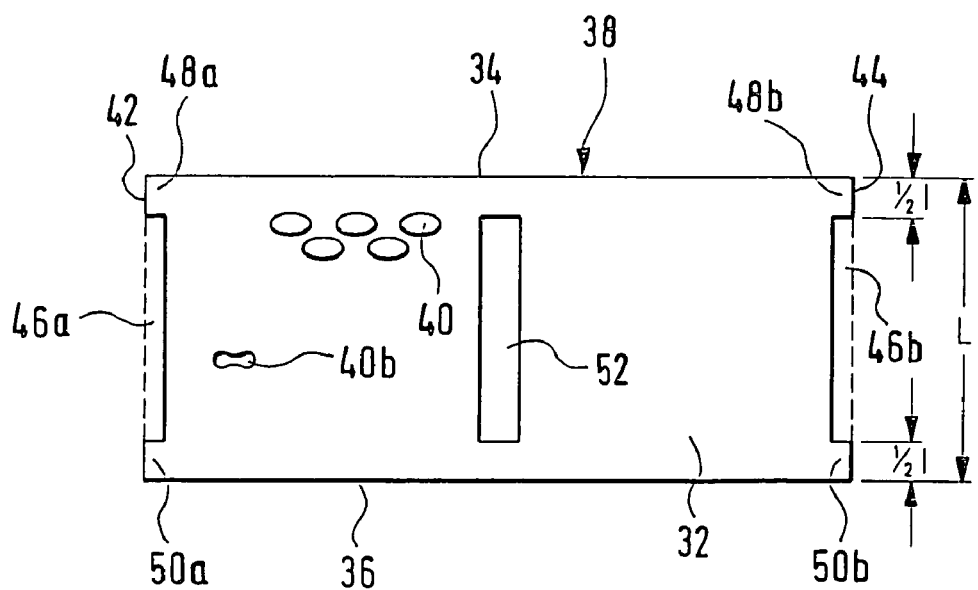
FIG. 3 shows the developed view of the prestressing device from FIG. 2.

The upper edge 34 of the prestressing device 30 rests against the counterpart surface 28 and the lower edge 36 rests against the piezoelectric actuator 20. As is particularly clear from the developed view in FIG. 3, the prestressing device 30 is manufactured out of a plate-shaped starting material 38. First, openings 40 are punched into this material, distributed over the entire surface 32. These openings are offset from one another in the circumferential and axial direction. For the sake of simplicity, only a few of these openings 40 are depicted in FIGS. 2 and 3, although the entire surface 32 is perforated with these openings 40. The openings 40 can be circular, oval, or elliptical, but they can also be embodied in a so-called "bone" shape, as depicted in FIG. 3, labeled with the reference numeral 40b.

With regard to FIG. 3, the plate-shaped starting material 38 has a left edge 42 and a right edge 44. A recess 46a, 46b is punched out from each of the two edges 42 and 44 (see dashed lines). These recesses begin a slight distance apart from the lower edge 36 and a slight distance apart from the upper edge 34. As a result, laterally protruding bridge pieces 48a and 48b remain in the region of the upper edge 34 and laterally protruding bridge pieces 50a and 50b remain in the region of the lower edge 36. A slot-like recess 52, which is the same height as the two recesses 46a and 46b and is twice the width of the respective recesses 46a and 46b, is punched out from the middle between the lateral edges 42 and 44.

The plate-shaped starting material 38 is then rolled or bent until the laterally protruding bridge pieces 48a, 48b and 50a, 50b touch each other at an abutment 53. This produces the tube spring 30 shown in FIG. 2. The recess formed between the bridge pieces 48a,b and 50a,b and the two recesses 46a and 46b has the same overall height and width as the recess 52. The now-abutting bridge pieces 48a, 48b and 50a, 50b are not welded to each other, but rather abut against each other evenly without engaging each other frictionally. The total length l of the abutment 53 is significantly less than the length L of the tube spring 30 (see FIG. 3).

In the region of the abutment 53 between the bridge pieces 48a, 48b and 50a, 50b, the rigidity of the tube spring 30 in the longitudinal direction 54 is weakened in comparison to the neighboring circumferential surface 32. There is a correspondingly significant drop at this point in the compressive force that the tube spring 30 can exert on the piezoelectric actuator 20 in the longitudinal direction 54. The curve of the compressive force acting in the longitudinal direction 54 is depicted with a dot-and-dash line 56 in FIG. 2. But since there is an identical recess 52 situated exactly radially opposite the recess 46, the compressive force 56 drops in this region, too, in comparison to the neighboring regions. The compressive force curve 56 is thus essentially symmetrical on the whole in relation to the longitudinal axis 54 of the tube spring 30 so that a bending moment M, which is oriented around an axis 58 extending transversely in relation to the longitudinal axis 54, is of only insignificant magnitude. Consequently, the tube spring 30 exerts only a very slight bending moment M on the piezoelectric actuator 20, which has a favorable impact on its service life.

Figure 4:
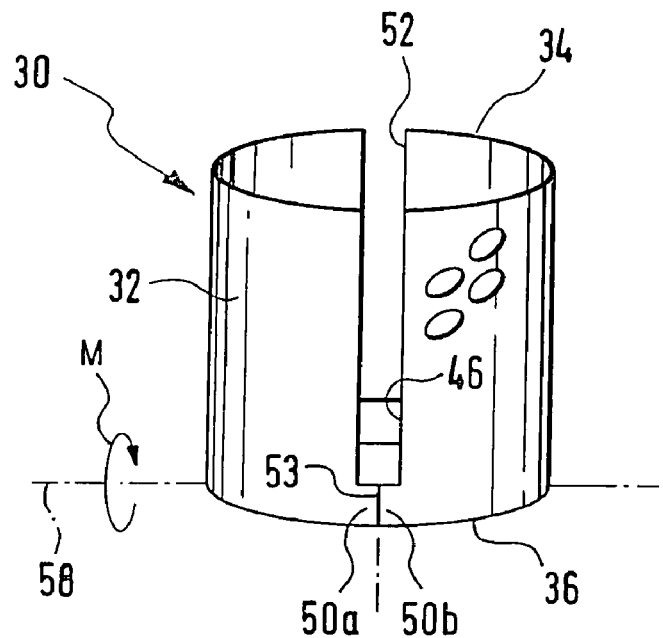
FIG. 4 is a depiction similar to FIG. 2 of a second exemplary embodiment.
Figure 5:
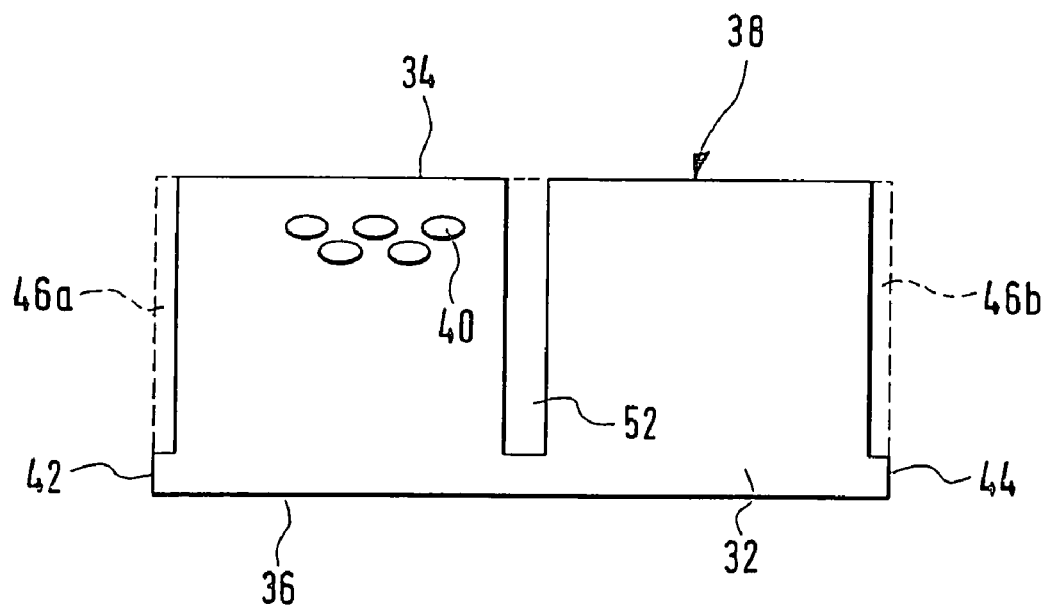
FIG. 5 is a depiction similar to FIG. 3 of the exemplary embodiment from FIG. 4.

FIGS. 4 and 5 show a modified embodiment form of a tube spring 30. Elements and regions that have functions equivalent to elements and regions already explained above in connection with FIGS. 2 and 3 are provided here with the same reference numerals and not discussed in further detail. Moreover, for the sake of clarity, not all of the reference numerals have been included.

The essential difference between the tube spring 30 shown in FIGS. 4 and 5 and the one shown in FIGS. 2 and 3 is the fact that there are no laterally protruding bridge pieces in the region of the upper edge 34. In addition, the recess 52 extends all the way to the upper edge 34. This further reduces the rigidity difference of the tube spring 30 in the region of the abutment 53 in relation to the radially neighboring regions. The resulting bending moment M is therefore even smaller.

Figure 6:
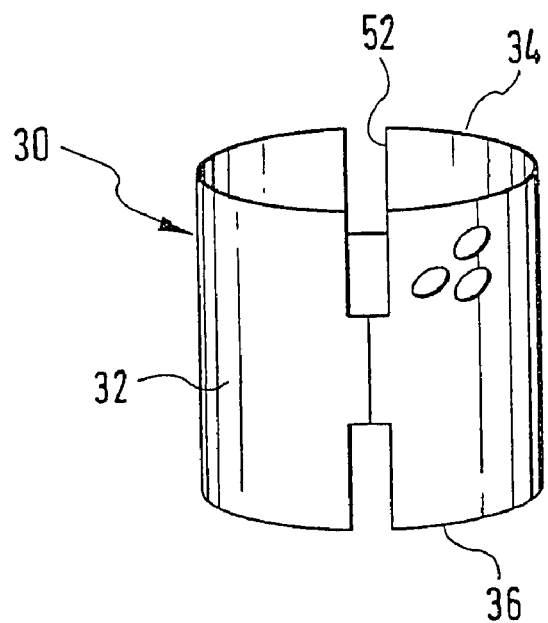
FIG. 6 is a depiction similar to FIG. 2 of a third exemplary embodiment.
Figure 7:
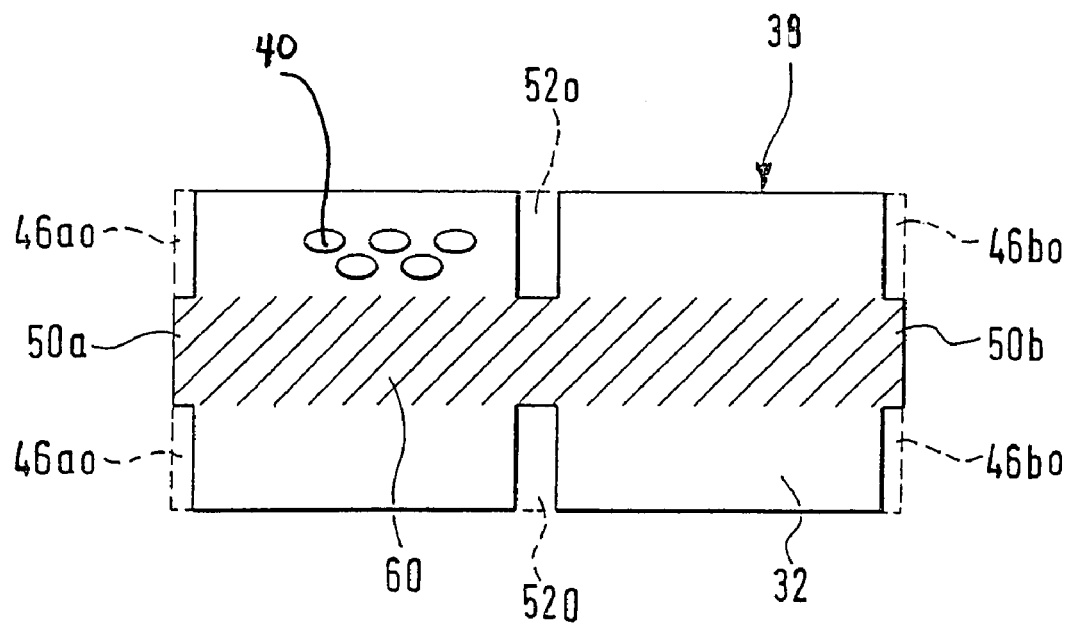
FIG. 7 is a depiction similar to FIG. 3 of the exemplary embodiment from FIG. 6.

FIGS. 6 and 7 show another variant of a tube spring 30. Here, too, those elements and regions that have functions equivalent to elements and regions that have already been explained in connection with the preceding exemplary embodiments are provided with the same reference numerals and are not discussed in further detail.

In the tube spring 30 shown in these figures, the laterally protruding bridge pieces 50a and 50b are situated in the axial middle of the plate-shaped starting material 38 and consequently also in the axial middle of the tube spring 30. There are thus upper recesses 46ao and 46bo above the bridge pieces 50a and 50b, whereas the recesses below the bridge pieces 50a and 50b are labeled with the reference numerals 46au and 46bu. The central recess 52 is then also divided in two and has a recess 52u extending from the lower edge 36 and a recess 52o extending from the upper edge 34.

FIG. 7 shows a shaded region 60 halfway up, which is situated, in terms of the axial direction, at exactly the height of the laterally protruding bridge pieces 50a and 50b and in turn corresponds to the distance between two the central recesses 52o and 52u. There are no openings 40 in this region. This further increases the uniformity of the rigidity of the tube spring 30 in the circumferential direction.

In the exemplary embodiments described above, the tube spring 30 has two radially opposing recesses 46 and 52. Fundamentally, however, it is conceivable for there to be any number of recesses, provided that they are distributed uniformly over the circumference of the tube spring so as to reduce the bending moment exerted by the abutting longitudinal edges 42 and 44.

The foregoing relates to a preferred exemplary embodiment of the invention, it being understood that other variants and embodiments thereof are possible within the spirit and scope of the invention, the latter being defined by the appended claims.

The invention claimed is:

1. A fuel injection valve for an internal combustion engine, comprising a valve element, a piezoelectric actuator at least indirectly controlling the switched position of the valve element depending on the switched state of the piezoelectric actuator, and a tubular, largely cylindrical prestressing device prestressing the piezoelectric actuator, the prestressing device being manufactured out of a plate-shaped starting material and having at least two longitudinal edges that abut each other in a first region in such a way that the longitudinal rigidity of the prestressing device is altered in this first region, the prestressing device having at least a second region whose longitudinal rigidity differs from that of a neighboring region, the second region being situated in relation to the abutting longitudinal edges of the first region so as to reduce the bending moment that acts on the piezoelectric actuator and is generated by the altered longitudinal rigidity in the first region of the abutting longitudinal edges.

2. The valve device according to claim 1, wherein the longitudinal edges that abut each other are not connected to each other in a frictionally engaging fashion, and wherein the prestressing device further comprises a recess extending largely in the longitudinal direction of the prestressing device, at least approximately opposite from the abutting longitudinal edges in the radial direction.

3. The fuel injection device according to claim 2, wherein the length of the abutting longitudinal edges of the prestressing device, viewed in the axial direction, is less than the overall longitudinal span of the prestressing device.

4. The fuel injection device according to claim 3, wherein the longitudinal edges of the prestressing device abut each other only in the region of the axial edges of the prestressing device.

5. The fuel injection device according to claim 3, wherein the longitudinal edges of the prestressing device abut each other only in the region of one axial edge of the prestressing device.

6. The fuel injection device according to claim 3, wherein the longitudinal edges of the prestressing device abut each other only in the region of the axial middle of the prestressing device.

7. The fuel injection device according to claim 3, wherein the abutting longitudinal edges of the prestressing device are delimited in their longitudinal direction by means of at least one recess, which, in terms of position and/or geometry, is similar or identical to the radially opposite recess.

8. The fuel injection device according to claim 4, wherein the abutting longitudinal edges of the prestressing device are delimited in their longitudinal direction by means of at least one recess, which, in terms of position and/or geometry, is similar or identical to the radially opposite recess.

9. The fuel injection device according to claim 5, wherein the abutting longitudinal edges of the prestressing device are delimited in their longitudinal direction by means of at least one recess, which, in terms of position and/or geometry, is similar or identical to the radially opposite recess.

10. The fuel injection device according to claim 6, wherein the abutting longitudinal edges of the prestressing device are delimited in their longitudinal direction by means of at least one recess, which, in terms of position and/or geometry, is similar or identical to the radially opposite recess.

11. The fuel injection device according to claim 3, wherein openings are distributed over the surface of the prestressing device, except in a region extending at the height of the axial region of the prestressing device in which the longitudinal edges abut each other.

12. The fuel injection device according to claim 4, wherein openings are distributed over the surface of the prestressing device, except in a region extending at the height of the axial region of the prestressing device in which the longitudinal edges abut each other.

13. The fuel injection device according to claim 5, wherein openings are distributed over the surface of the prestressing device, except in a region extending at the height of the axial region of the prestressing device in which the longitudinal edges abut each other.

14. The fuel injection device according to claim 6, wherein openings are distributed over the surface of the prestressing device, except in a region extending at the height of the axial region of the prestressing device in which the longitudinal edges abut each other.

15. The fuel injection device according to claim 7, wherein openings are distributed over the surface of the prestressing device, except in a region extending at the height of the axial region of the prestressing device in which the longitudinal edges abut each other.

16. The fuel injection device according to claim 8, wherein openings are distributed over the surface of the prestressing device, except in a region extending at the height of the axial region of the prestressing device in which the longitudinal edges abut each other.

17. The fuel injection device according to claim 9, wherein openings are distributed over the surface of the prestressing device, except in a region extending at the height of the axial region of the prestressing device in which the longitudinal edges abut each other.

18. The fuel injection device according to claim 10, wherein openings are distributed over the surface of the prestressing device, except in a region extending at the height of the axial region of the prestressing device in which the longitudinal edges abut each other.

19. The fuel injection device according to claim 2, wherein the recess of the prestressing device is punched out from the plate-shaped starting material.

20. The fuel injection device according to claim 3, wherein the recess of the prestressing device is punched out from the plate-shaped starting material.

* * * * *